(12) United States Patent
Park

(10) Patent No.: US 9,281,440 B2
(45) Date of Patent: *Mar. 8, 2016

(54) ELECTROLUMINESCENCE DEVICE USING INDIRECT BANDGAP SEMICONDUCTOR

(71) Applicant: Seoul National University R&DB FOUNDATION, Seoul (KR)

(72) Inventor: Byung-Gook Park, Seoul (KR)

(73) Assignee: Seoul National University R&DB FOUNDATION (KR)

( * ) Notice: Subject to any disclaimer, the term of this patent is extended or adjusted under 35 U.S.C. 154(b) by 6 days.

This patent is subject to a terminal disclaimer.

(21) Appl. No.: 13/723,857

(22) Filed: Dec. 21, 2012

(65) Prior Publication Data

US 2013/0161653 A1 Jun. 27, 2013

(30) Foreign Application Priority Data

Dec. 23, 2011 (KR) .................. 10-2011-0141745

(51) Int. Cl.
 *H01L 33/02* (2010.01)
 *H01L 33/26* (2010.01)

(52) U.S. Cl.
 CPC ............... *H01L 33/02* (2013.01); *H01L 33/26* (2013.01)

(58) Field of Classification Search
 None
 See application file for complete search history.

(56) References Cited

U.S. PATENT DOCUMENTS 5,705,827 A * 1/1998 Baba et al. ............... 257/46
5,917,195 A    6/1999 Brown
6,204,083 B1 * 3/2001 Kodato et al. .............. 438/43
6,495,859 B2 * 12/2002 Fischer et al. .............. 257/97
7,254,151 B2 * 8/2007 Lieber et al. ............ 372/44.01
2010/0155698 A1 * 6/2010 Lieber et al. ............... 257/14
2010/0213477 A1 * 8/2010 Xu et al. .................... 257/94
2011/0001121 A1 * 1/2011 Ahn ........................ 257/13
2012/0001283 A1 * 1/2012 Assefa et al. ............. 257/431

FOREIGN PATENT DOCUMENTS

KR    10-2007-0122509    12/2007

OTHER PUBLICATIONS

Tsuji et al., "Selective epitaxial growth of GaAs on Si with strained short-period superlattice by molecular beam epitaxy under atomic hydrogen irradiation", J. Vac. Sci. Technol. B 22 (3), May/Jun. 2004, pp. 1428-1431.*

(Continued)

*Primary Examiner* — Johannes P Mondt
(74) *Attorney, Agent, or Firm* — Gerald E. Hespos; Michael J. Porco; Matthew T. Hespos

(57) ABSTRACT

This invention provides an electroluminescence device comprising an indirect bandgap semiconductor layer, such as silicon or germanium, having a local conduction-band minimum at the Γ-point in an E-k diagram for using as a light emitting layer, and a direct bandgap semiconductor layer formed by a heterojunction on the indirect bandgap semiconductor layer for using as an electron supply means transporting electrons from a Γ-valley to a Γ-valley when a forward-biased voltage is applied, wherein a light emission is occurred by recombining the electrons transported to the Γ-valley of the indirect bandgap semiconductor layer with holes located at a valance band maximum of the indirect bandgap semiconductor layer.

10 Claims, 12 Drawing Sheets

(56) References Cited

OTHER PUBLICATIONS

Madelung, O., "Semiconductors: Data Handbook", $3^{rd}$ edition, Springer-Verlag, Berlin-Heidelberg 2004 (Germany), B—Physical Data, chapters 1 and 2, pp. 5-159.*

From Shur et al., "Compound-semiconductor field-effect transistors" in "Modern Semiconductor Device Physics", Ch. 2, pp. 81 and 104-106, Ed. Sze, S.M., John Wiley & Sons, New York 1998.*

Jifeng Liu et al., Band-Engineered Ge-on-Si Lasers, IDEM, pp. 146-149, 2012.

"Semiconductor Physics and Devices", Basic Principles, Second Edition—Donald A. Neamen—University of New Mexico. pp. 52-54.

"Solid State Electronic Devices", Fifth Edition—Ben G. Streetman and Sanjay Banerjee—Microelectronics Research Center, Department of Electrical and Computer Engineering, The University of Texas at Austin. p. 72.

"Semiconductor Physics and Devices", Basic Principles, Second Edition—Donald A. Neamen—University of New Mexico. pp. 332-334; pp. 565-569.

* cited by examiner

ELECTROLUMINESCENCE DEVICE USING INDIRECT BANDGAP SEMICONDUCTOR

CROSS-REFERENCE TO RELATED APPLICATION

This application claims priority under 35 U.S.C. 119 of Korean Patent Application No. 10-2011-0141745 filed on Dec. 23, 2011, the entire contents of which are hereby incorporated by reference.

BACKGROUND OF INVENTION

1. Field of the Invention

The present invention relates to optoelectronic devices and more particularly to electroluminescence devices using indirect bandgap semiconductors.

2. Description of the Related Art

Optoelectronic devices can be largely divided into three categories such as devices for converting electrical energy into light energy (e.g., light emitting diodes and laser diodes), devices for detecting light signals (e.g., photodetectors) and devices for converting light energy into electrical energy (e.g., photovoltaic cells and solar cells).

Among the optoelectronic devices, devices that convert electrical energy into light energy are called electroluminescence devices and when a voltage is applied to both ends of a specific material layer (a light emitting layer) of the electroluminescence device such as a light emitting diode (LED), it emits a light corresponding to an energy bandgap (hereafter, simply called "a bandgap") of the light emitting layer.

When one or more atoms are brought together to form a solid, electron wave functions having a potential well of each atom are overlapped. So energy states to be occupied by electrons split into energy bands according to whether filled with electrons or not.

The lower band filled with electrons is called the valence band VB, the upper band not filled with electrons is called the conduction band CB and the forbidden band called a bandgap where no electrons are allowed exists between the lower and upper bands.

Thus physical characteristics (electrical characteristics) of a solid can be explained by the energy bands. Semiconductors can be defined as materials having bandgaps smaller than those of dielectric materials (insulators) and larger than those of conductive materials (conductors).

And, when energy bands of semiconductors are expressed with an energy (E) and a wave number (k or a wave vector) as shown in the E-k diagrams (FIGS. 1 and 2), energy values of the valance and conduction bands are changed by the electron-moving directions, namely, the <100> or <111> direction in a lattice. At this time, the bandgap energy $E_g$ is defined as the difference between the conduction band minimum and the valence band maximum.

In an E-k diagram, the conduction band minimum and the valence band maximum are dependent on semiconductor materials and have the same k value as shown in FIG. 1 or different k values as shown in FIG. 2. The former represents direct bandgap semiconductors and the latter represents indirect bandgap semiconductors.

In other words, conduction band minima and valence band maxima of direct bandgap semiconductors (e.g., GaAs, GaN, etc.) exist at the Γ-point having k=0, while in indirect bandgap semiconductors (e.g., Si, Ge, etc), valence band maxima exist at the Γ-point but conduction band minima exist at the other points (points forming an X- or an L-valleys).

FIG. 3 shows the E-k diagram of an indirect bandgap semiconductor having a local conduction-band minimum that exists at the Γ-point and an energy difference $\Delta E_{c1}$ from the conduction band minimum.

To obtain transitions of electrons between the bands, both energy and momentum must be conserved before and after each transition.

By the energy conservation, photons having the wavelength λ [nm] of Equation (1) corresponding to a bandgap $E_g$ [eV] are absorbed or emitted during the transition of electrons between the bands.

$$\lambda = 1240/E_g \tag{1}$$

And, by the momentum conservation, momenta of photons are extremely smaller than those of transited electrons. Thus, according to Equation (2), the transited electrons have almost the same k value in the E-k diagram before and after each transition.

$$P = h/\lambda = \hbar k \tag{2}$$

where P is a momentum, h is Planck's constant, λ is the wavelength, $\hbar$ is $h/2\pi$, and k is a wave number.

For this reason, electroluminescence devices have been mainly formed with direct bandgap semiconductors until now.

By the way, the conventional electroluminescence devices using direct bandgap semiconductors have some problems. First, the manufacturing cost is too high to grow a light emitting layer (i.e., an active layer) with direct bandgap compound semiconductors on a costly compound semiconductor substrate. Second, the conventional electroluminescence devices cannot be integrated together with common circuit elements generally fabricated on a silicon substrate.

Furthermore, because of many advantages of silicon (Si), there are many studies for using Si to form a substrate of electroluminescence devices.

However, most of the studies are to grow a light emitting layer with compound semiconductors as direct bandgap materials on one side of silicon substrate, to increase the degree of integration with circuit elements, or to more reduce a forward-biased voltage $V_f$ in an heterojunction of Si and compound semiconductor (refer to patent reference 1 as Korean Publication No. 10-2007-0122509). The conventional technologies have problems that entail extra processes and costs to especially form a costly light emitting layer on a silicon substrate.

Furthermore, there is a try that silicon is used to a light emitting layer of an electroluminescence device, but, as mentioned above, because silicon is an indirect bandgap semiconductor, conduction band minimum and valence band maximum are placed on different k values from each other. Thus direct transitions of electrons are almost impossible.

To overcome this problem, patent reference 2 (U.S. Pat. No. 5,917,195) discloses a technology for a light emission, as shown in FIG. 4, by coupling between holes located at valence band maximum and electrons transported from an X-valley to a Γ-valley through changing the energy and momentum of electrons by lattice resonators such as phonon resonators 1 in several resonating layers made with the radioactive isotopes of silicon $Si^{28}$, $Si^{29}$ and $Si^{30}$. In this case, difficult processes to form several resonating layers using the radioactive isotopes of silicon $Si^{28}$, $Si^{29}$ and $Si^{30}$ are needed.

And according to non-patent reference 1 (Jifeng Liu et al., Band-Engineered Ge-on-Si Lasers, IEDM, pp. 146-149, 2010), a lattice structure of germanium Ge of an indirect bandgap semiconductor is modified by a tensile strained, as shown in FIG. 5, for changing an energy band of conduction band, in other word, for regulating to raise the X-valley having a conduction band minimum and to lower the Γ-valley at k=0 to the similar energy of the X-valley, and then some electrons injected by doping of n-type impurities enable the transport into a Γ-valley for recombining with holes located at the valence band maximum. In this case, difficult processes to especially modify a lattice structure for forming a light emitting layer with an indirect bandgap semiconductor are required.

Therefore, because technologies for efficiently using indirect bandgap semiconductors such as silicon and germanium to form a light emitting layer have not been developed, electroluminescence devices show the limitations of fabrication costs and various applications.

SUMMARY OF THE INVENTION

The present invention is contrived to overcome the conventional problem that a light emitting layer is not efficiently formed with indirect bandgap semiconductors, such as silicon and germanium, widely used as a semiconductor substrate. Based on the idea indirect bandgap semiconductors can have local conduction-band minima at the Γ-point, the objective of the present invention is to suggest that when electrons are externally supplied to a Γ-valley of an indirect bandgap semiconductor, the indirect bandgap semiconductor itself is able to be used as a light emitting layer which emits a light at room temperature and to provide electroluminescence devices using the same.

To achieve the mentioned objective, an electroluminescence device according to the present invention comprises: an indirect bandgap semiconductor layer forming a Γ-valley with a local conduction-band minimum at the Γ-point in an E-k diagram; and a direct bandgap semiconductor layer formed by a heterojunction on the indirect bandgap semiconductor layer for supplying electrons to the Γ-valley of the indirect bandgap semiconductor layer, wherein the indirect bandgap semiconductor layer is used as a light emitting layer.

Here, the direct bandgap semiconductor layer preferably has a bandgap larger than the difference between a Γ-valley minimum of the indirect bandgap semiconductor layer and a valence band maximum of the indirect bandgap semiconductor layer.

The direct bandgap semiconductor layer preferably has a conduction band minimum larger than or equal to the Γ-valley minimum of the indirect bandgap semiconductor layer and has a valence band maximum smaller than the valence band maximum of the indirect bandgap semiconductor layer.

The direct bandgap semiconductor layer preferably has a lattice constant 1% or less different from that of the indirect bandgap semiconductor layer.

The direct bandgap semiconductor layer preferably has a conduction band minimum located at the Γ-point or within the Γ-valley of the indirect bandgap semiconductor layer.

The direct bandgap semiconductor layer can have a lattice constant adjusted by tensile stress or compressive stress, or be formed with a single layer or at least two layers by alloying with two or more atoms.

The indirect bandgap semiconductor layer and the direct bandgap semiconductor layer can have a contact portion for supplying an external power respectively and the indirect bandgap semiconductor layer can emit a light by recombining electrons transported from a Γ-valley conduction band of the direct bandgap semiconductor layer to a Γ-valley conduction band of the indirect bandgap semiconductor layer with holes located at a valence band maximum of the indirect bandgap semiconductor layer when an external power are applied to the contact portion.

The indirect bandgap semiconductor layer can be doped with p-type impurities and the direct bandgap semiconductor layer is doped with n-type impurities.

The indirect bandgap semiconductor layer can be a semiconductor substrate itself having an indirect bandgap or an upper part of a semiconductor substrate having an indirect bandgap defined by etching.

The indirect bandgap semiconductor layer can be formed by epitaxial growth on a semiconductor substrate having an indirect bandgap.

The semiconductor substrate can be the same semiconductor material as the indirect bandgap semiconductor layer and can be doped with p-type impurities, and the indirect and direct bandgap semiconductor layers can be doped with higher concentration than the semiconductor substrate.

An intrinsic semiconductor layer undoped with impurities can be further formed between the indirect and direct bandgap semiconductor layers.

The intrinsic semiconductor layer can be a material layer having the same components as the direct bandgap semiconductor layer.

The indirect bandgap semiconductor layer can be formed on a semiconductor substrate having an indirect bandgap as one body and the semiconductor substrate can have a contact portion to apply an external power to the indirect bandgap semiconductor layer.

The present invention enables to use an indirect bandgap semiconductor layer itself as a light emitting layer at room temperature by forming a direct bandgap semiconductor layer on the indirect bandgap semiconductor layer with a Γ-valley into a heterojunction and supplying electrons from a conduction band in the Γ-valley of the direct bandgap semiconductor layer to the Γ-valley of the indirect bandgap semiconductor layer when an external power is applied.

And the present invention enables to integrate optoelectronic devices with circuit elements for operating the optoelectronic devices, to reduce fabrication costs significantly and to apply to various optoelectronic devices by forming the light emitting layer with indirect bandgap semiconductors such as silicon and germanium widely used as a semiconductor substrate.

In these drawings, the following reference numbers are used throughout: reference numbers 10 and 15 indicate an indirect bandgap semiconductor layer, 11 and 13 a semiconductor substrate, 12, 16 and 18 a contact portion of an indirect bandgap semiconductor layer, 14 a contact of an indirect bandgap semiconductor layer, 20 and 21 a direct bandgap semiconductor layer, 22 a contact portion of a direct bandgap semiconductor layer, 24 a contact of a direct bandgap semiconductor layer, 100 a junction part between a Γ-valley of a conduction band $E_{C3}$ of a semiconductor layer having a direct bandgap and a Γ-valley of a conduction band $E_{C1}$ of a semiconductor layer having an indirect bandgap, 110 a curved energy-band surface of a semiconductor layer having an indirect bandgap, 120 an curved energy-band surface of a semiconductor layer having a direct bandgap, 130 an E-x plane at k=0, 140 a line connected to Γ-valley minima of each region, and 150 an electron waterway.

DETAILED DESCRIPTION

Detailed descriptions of preferred embodiments of the present invention are provided below with respect to accompanying drawings.

A main technical idea of the present invention is to embody electroluminescence devices using an indirect bandgap semiconductor layer itself as a light emitting layer for emitting a light by transporting electrons to a Γ-valley of an indirect bandgap semiconductor layer from an external power and recombining the electrons with holes located at a valance band maximum of the indirect bandgap semiconductor layer.

Therefore, the present invention should not be restricted to the herein described embodiments with accompanying FIGS. 6 to 12 but be considered that it can be embodied in various modifications.

To embody the technical idea of the present invention, a first aspect to be needed is selecting an indirect bandgap semiconductor layer to use as a light emitting layer. Here, the indirect bandgap semiconductor layer should form a Γ-valley having a conduction band CB with a localized minimum, i.e., a local conduction-band minimum, at the Γ-point (k=0, hereafter the same) in an E-k diagram.

And a second aspect is finding an electron supply means for transporting electrons efficiently to the Γ-valley conduction band of the indirect bandgap semiconductor layer.

The electron supply means can be variously embodied, but for transporting electrons efficiently to a Γ-valley conduction band of an indirect bandgap semiconductor layer, it is preferred to select a direct bandgap semiconductor layer having a conduction band minimum at the Γ-point or on k within a Γ-valley of an indirect bandgap semiconductor layer in an E-k diagram as the means and to form the direct bandgap semiconductor layer on the indirect bandgap semiconductor layer by a heterojunction.

Figure 18:
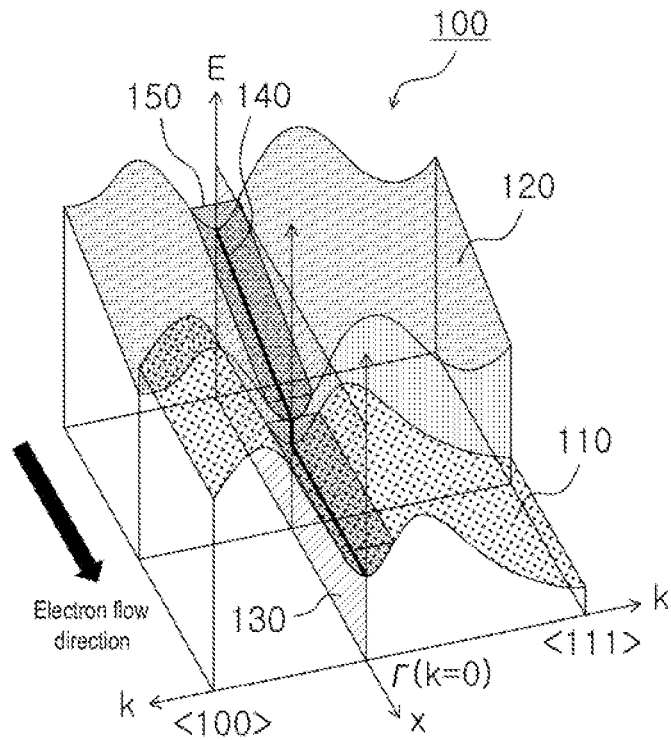
FIG. 18 is an energy-band diagram showing a 3-dimensional expression by E(energy)-k(momentum)-x(location) for a specific portion 100 shown in FIG. 17.

By the mentioned composition, as shown in FIG. 18, it is possible to transport electrons from a Γ-valley to a Γ-valley. In other words, electrons injected from an external power, etc. can be firstly collected at a Γ-valley of a direct bandgap semiconductor layer 120 to form an electron waterway 150 as an electron transport channel, and then the electrons can be efficiently transported to a Γ-valley of an indirect bandgap semiconductor layer 110 by adjusting an energy level of a conduction band 140 to give a slope to the electron waterway 150 by the external power, etc. As mentioned above, the electrons collected secondly at the Γ-valley of the indirect bandgap semiconductor layer 110 to form another electron waterway are recombined with holes located at a valance band maximum of the indirect bandgap semiconductor layer with emitting a light.

At this time, to embody an electroluminescence device emitting a light only when an external power turns on, it is preferable that the indirect and direct bandgap semiconductor layers form a pn junction for supplying and cutting off electrons from the direct bandgap semiconductor layer, in other words, for operating as a switch.

To embody the pn junction, it is preferable that a direct bandgap semiconductor layer is doped with n-type impurities for supplying electrons as an electron-supply part and an indirect bandgap semiconductor layer is doped with p-type impurities for supplying holes as a hole-supply part and for recombining the electrons and holes to emit a light as a light emitting layer.

And to emit a light from the indirect bandgap semiconductor layer as a light emitting layer in a turn-on state of an electroluminescence device, when a forward-biased voltage $V_f$ is applied across a pn junction between the p-type indirect bandgap semiconductor layer and the n-type direct bandgap semiconductor layer, a Γ-valley conduction band of the n-type direct bandgap semiconductor layer must be raised above a Γ-valley conduction band of the p-type indirect bandgap semiconductor layer to easily transport electrons from a Γ-valley to a Γ-valley, and also even if a valence band of the p-type indirect bandgap semiconductor layer comes down by the forward-biased voltage, holes gathered in a valence band of the p-type indirect bandgap semiconductor layer must be prevented from leaking to the n-type direct bandgap semiconductor layer, etc.

Thus, to meet the above-mentioned conditions, it is needed that a bandgap of the direct bandgap semiconductor layer is larger than the difference between a Γ-valley minimum of the indirect bandgap semiconductor layer and a valence band maximum of the indirect bandgap semiconductor layer.

Referring to FIGS. 13 to 18, more detailed descriptions of the above-mentioned conditions are disclosed.

Figure 13:
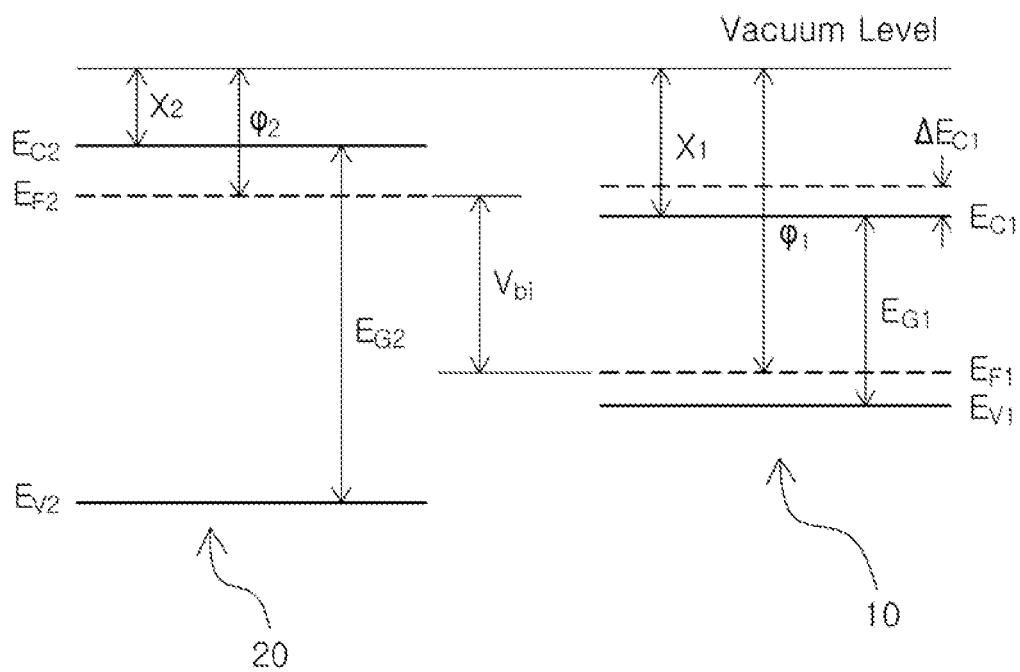
FIG. 13 is energy-band diagrams of a p-type indirect bandgap semiconductor layer 10 and an n-type direct bandgap semiconductor layer 20 showing physical characteristic before forming a junction according to one embodiment of the present invention.

FIG. 13 is energy-band diagrams of a p-type indirect bandgap semiconductor layer 10 and an n-type direct bandgap semiconductor layer 20 showing physical characteristic before forming a junction according to one embodiment of the present invention.

In FIG. 13, $X_1$ and $X_2$ are an electron affinity of the p-type indirect bandgap semiconductor layer 10 and the n-type direct bandgap semiconductor layer 20, respectively, and it is needed as $X_1 > X_2$.

$\Phi_1$ and $\Phi_2$ are a work function of each layer and $V_{bi}$ is a built-in potential.

Figure 14:
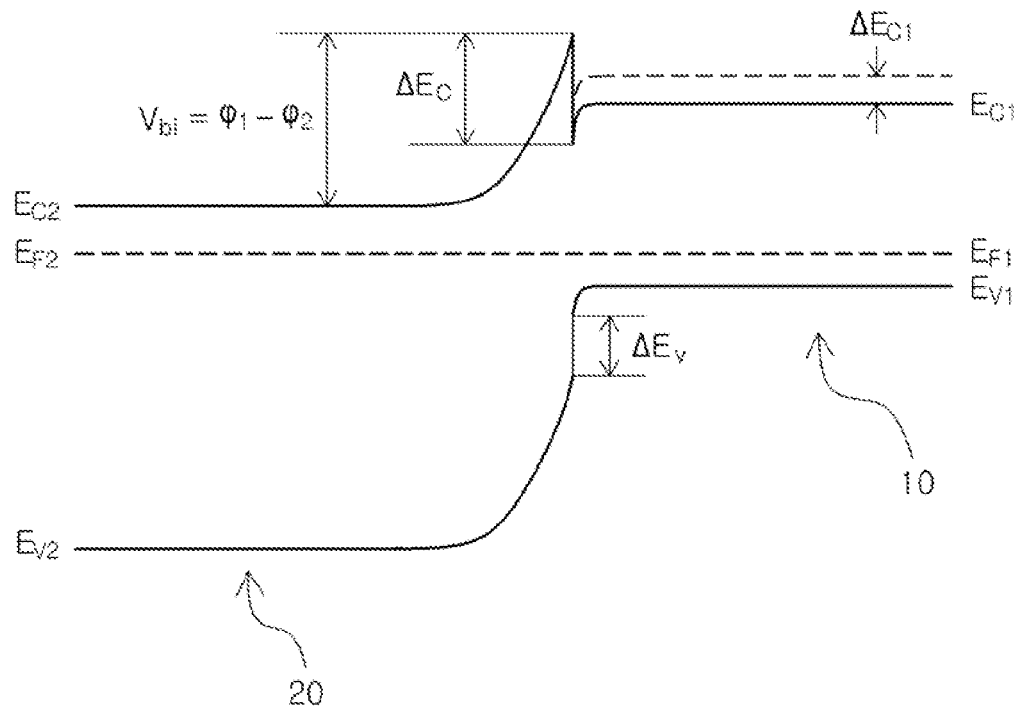
FIG. 14 is an energy-band diagram of a heterojunction of the p-type indirect bandgap semiconductor layer 10 and the n-type direct bandgap semiconductor layer 20 shown in FIG. 13 across which no biased voltage is applied in an equilibrium state.

As shown in FIG. 13, $V_{bi}$ is defined as the energy difference $E_{F2} - E_{F1}$ of Fermi levels before forming a junction. In an equilibrium state that Fermi levels of both sides equal to each other after forming a junction, as shown in FIG. 14, $V_{bi}$ is appeared as a built-in potential and has a size as $V_{bi} = \Phi_1 - \Phi_2$.

Figure 1:
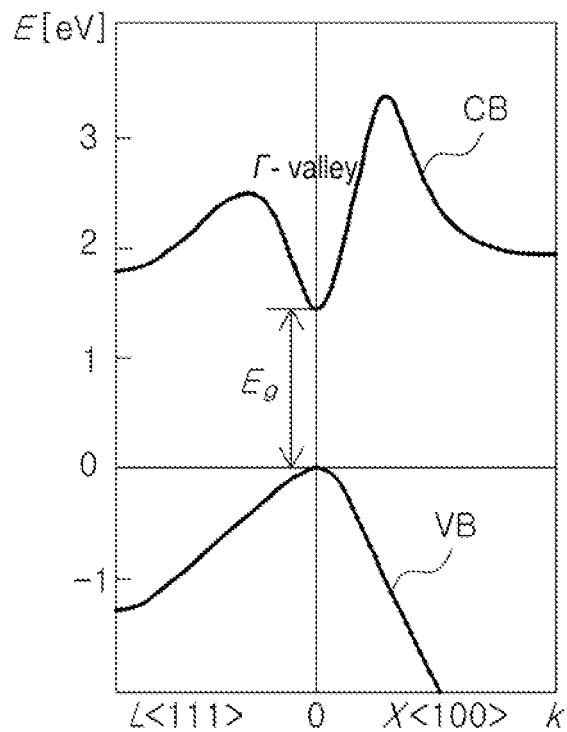
FIG. 1 is one example of an E-k diagram of semiconductor having a direct bandgap.
Figure 2:
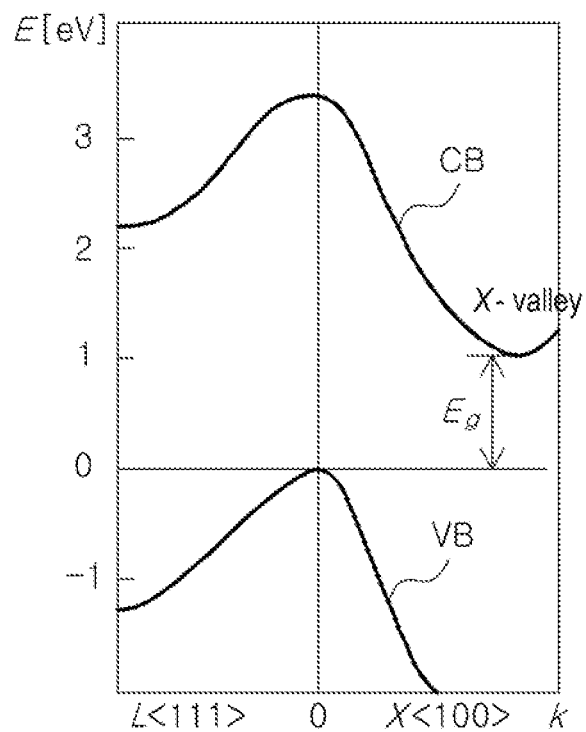
FIG. 2 is one example of an E-k diagram of semiconductor having an indirect bandgap.
Figure 3:
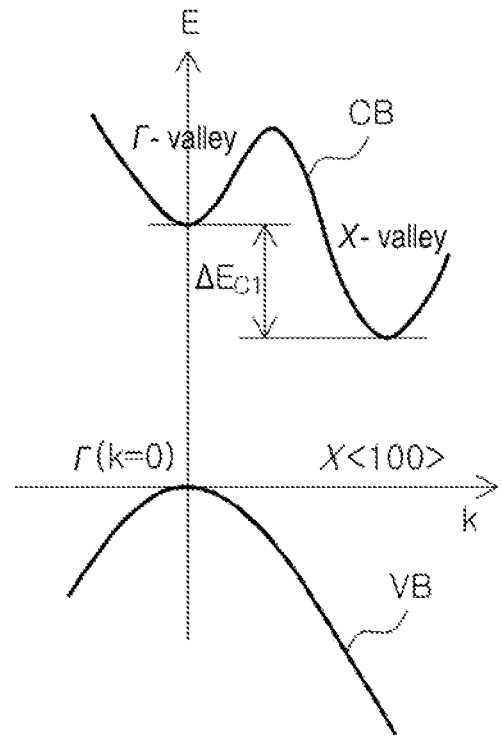
FIG. 3 is an E-k diagram showing one embodiment of an indirect bandgap semiconductor having a local conduction-band minimum at the Γ-point.
Figure 4:
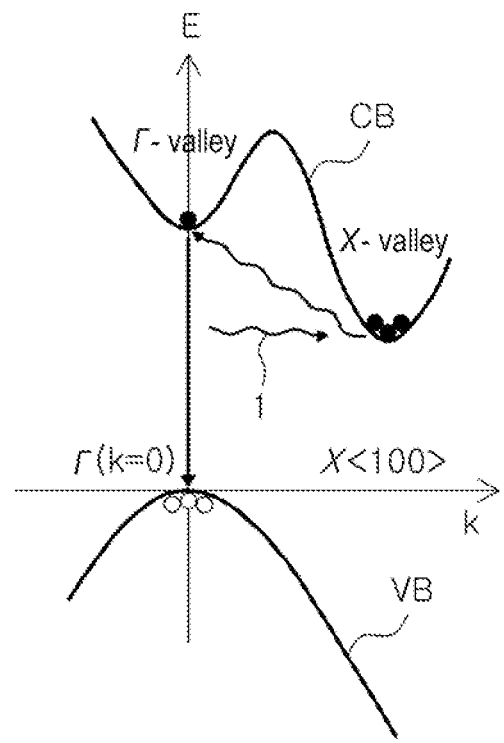
FIG. 4 is a conceptive view for explaining the conventional technique to transport an electron placed in an X-valley to a Γ-valley through changing the energy and momentum of the electron placed in the X-valley by a phonon resonator 1 and transit to a valance band maximum.
Figure 5:
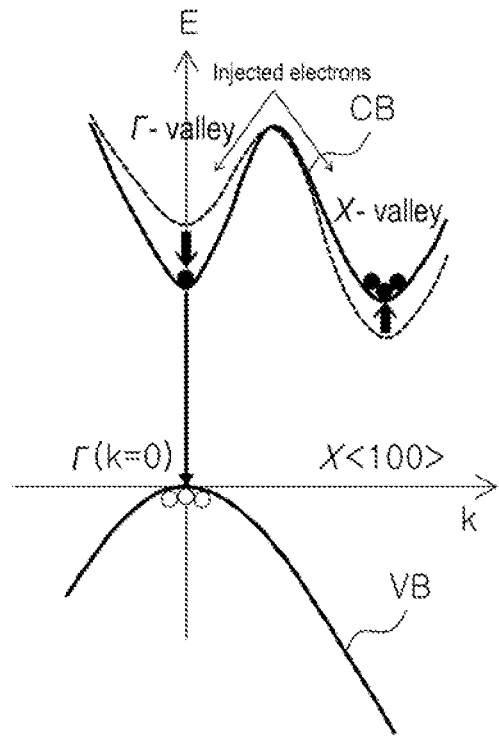
FIG. 5 is a conceptive view for explaining the conventional technique to modify an energy band of conduction band by a tensile strained of a lattice structure, transport a part of electrons injected by doping of n-type impurities into a Γ-valley and recombine with holes located in a valence band maximum.

On the other hand, $E_{G1}$ is a bandgap of the p-type indirect bandgap semiconductor layer 10 in FIG. 13 and is the energy difference between a conduction band minimum at any points (e.g., an X-valley) except the Γ-point and a valence band maximum as shown in FIG. 3. $E_{G2}$ is a bandgap of the n-type direct bandgap semiconductor layer 20 and is the energy difference between a conduction band minimum at the Γ-point and valence band maximum.

And, as shown in FIG. 3, $\Delta E_{C1}$ is the difference between a Γ-valley minimum and a conduction band minimum of the p-type indirect bandgap semiconductor layer 10.

Thus, when the forward-biased voltage $V_f$ is applied across the p-type indirect bandgap semiconductor layer 10 and the n-type direct bandgap semiconductor layer 20, it is needed to meet the condition of Equation (3) in order that electrons are supplied from the n-type direct bandgap semiconductor layer 20 and holes are coincidentally prevented to be leaked from the p-type indirect bandgap semiconductor layer 10.

$$E_{G2} > E_{G1} + \Delta E_{C1} \quad (3)$$

Under the condition of Equation (3), it is preferred to further meet two conditions: as shown in FIG. 14, in a junction of the n-type direct bandgap semiconductor layer 20 and the p-type indirect bandgap semiconductor layer 10, the difference $\Delta E_C$ of a conduction band minimum $E_{C2}$ of the n-type direct bandgap semiconductor layer 20 and a conduction band minimum $E_{C1}$ of the p-type indirect bandgap semiconductor layer 10 is larger than or equal to the difference $\Delta E_{C1}$ of a Γ-valley minimum and a conduction band minimum of the p-type indirect bandgap semiconductor layer 10, i.e., $\Delta E_C \geq \Delta E_{C1}$, and the difference $\Delta E_V$ of a valence band maximum $E_{V2}$ of the n-type direct bandgap semiconductor layer 20 and a valence band maximum $E_{V1}$ of the p-type indirect bandgap semiconductor layer 10 is smaller than zero i.e., $\Delta E_V < 0$.

Figure 15:
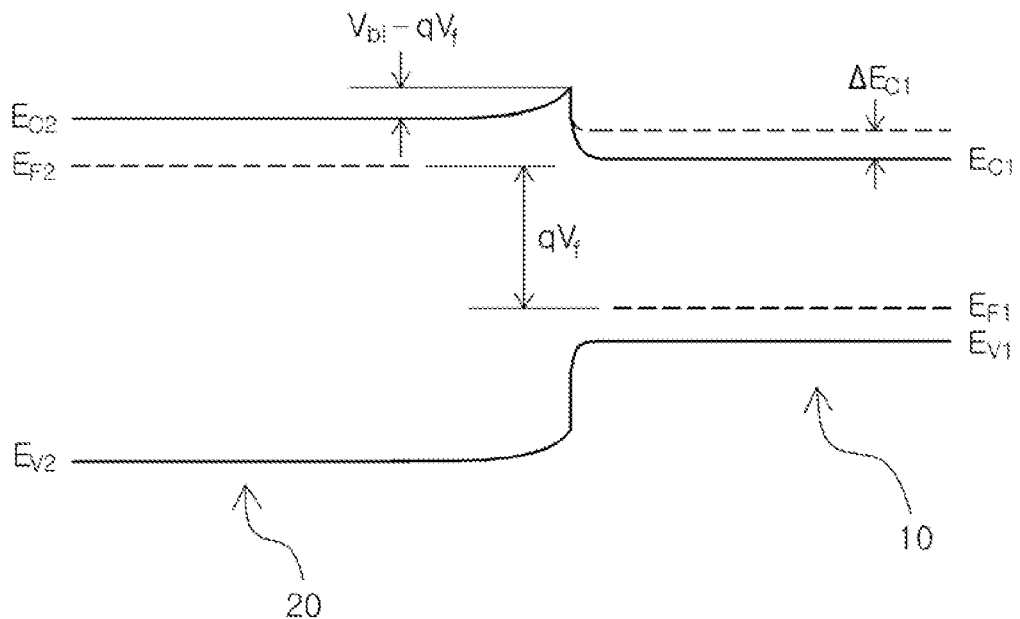
FIG. 15 is an energy-band diagram with forward-biased voltage applied across the pn heterojunction shown in FIG. 14.

FIG. 14 is an energy-band diagram of a heterojunction of the p-type indirect bandgap semiconductor layer 10 and the n-type direct bandgap semiconductor layer 20 shown in FIG. 13 across which no biased voltage is applied in an equilibrium state, and FIG. 15 is an energy-band diagram with a forward-biased voltage $V_f$ applied across the pn heterojunction shown in FIG. 14.

Therefore, according to this embodiment, the electroluminescence device does not emit a light by cutting off an electron supply to a Γ-valley of the p-type indirect bandgap semiconductor layer 10 at a turn-off state that an external voltage is not applied as shown in FIG. 14.

However, when an appropriate forward-biased voltage $V_f$ is applied, as shown in FIG. 15, the energy bands are moved, in other words, Fermi levels of both sides are shifted as large as $qV_f$. By the results, the conduction band minimum $E_{C2}$ of the n-type direct bandgap semiconductor layer 20 is raised up to an energy level of adding $\Delta E_{C1}$ to a conduction band minimum $E_{C1}$ of the p-type indirect bandgap semiconductor layer 10. In an E-k diagram, a Γ-valley conduction band of the n-type direct bandgap semiconductor layer 20 is moved up and stays above the Γ-valley conduction band of the p-type indirect bandgap semiconductor layer 10. And also even if the valence band maximum $E_{V1}$ of the p-type indirect bandgap semiconductor layer 10 comes down by the forward-biased voltage, the valence band maximum $E_{V1}$ of the p-type indirect bandgap semiconductor layer 10 cannot come down below a valence band maximum $E_{V2}$ of the n-type direct bandgap semiconductor layer 20 by the condition of Equation (3). Therefore, the former makes it enable to easily transport electrons from a Γ-valley to a Γ-valley, and the latter makes holes be prevented from leaking to the n-type direct bandgap semiconductor layer 20.

Thus, if an appropriate forward-biased voltage $V_f$ is applied to the electroluminescence device according to this embodiment to raise the conduction band minimum $E_2$ of the n-type direct bandgap semiconductor layer 20 to an energy level of adding $\Delta E_{C1}$ to the conduction band minimum $E_{C1}$ of the p-type indirect bandgap semiconductor layer 10, the p-type indirect bandgap semiconductor layer 10 is supplied with electrons by the Γ to Γ-valley transport from the n-type direct bandgap semiconductor layer 20 and emits a light by recombining the electrons with holes collected in the valence band maximum $E_{V1}$. It becomes a turn-on state.

Figure 16:
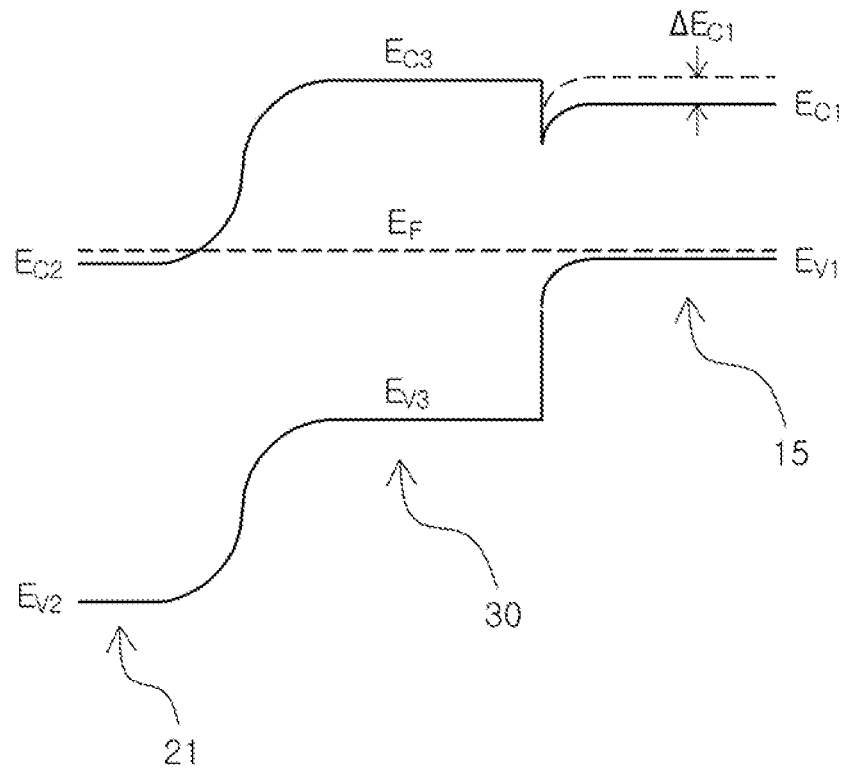
FIG. 16 is an energy-band diagram showing heterojunctions formed with a p-type indirect bandgap semiconductor layer 15, an intrinsic semiconductor layer 30 and an n-type direct bandgap semiconductor layer 21 according to another embodiment of the present invention with no biased voltage applied across each heterojunction in an equilibrium state.

FIG. 16 is an energy-band diagram showing heterojunctions formed with a p-type indirect bandgap semiconductor layer 15, an intrinsic semiconductor layer 30 and an n-type direct bandgap semiconductor layer 21 according to another embodiment of the present invention with no biased voltage applied across each heterojunction in an equilibrium state.

Figure 17:
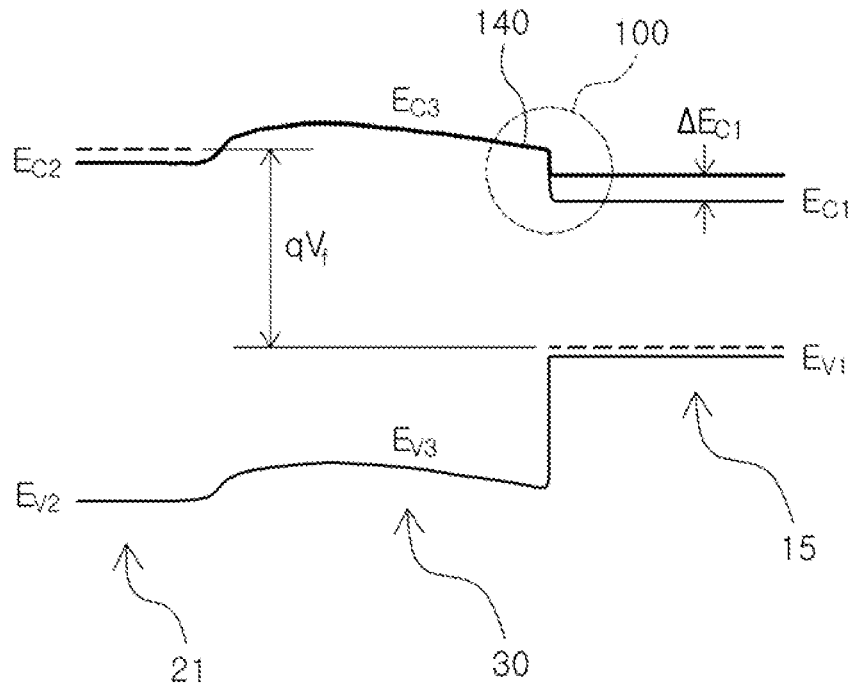
FIG. 17 is an energy-band diagram with forward-biased voltage applied across both ends of the heterojunctions shown in FIG. 16.

And FIG. 17 is an energy-band diagram with forward-biased voltage applied across both ends of the heterojunctions shown in FIG. 16 and FIG. 18 is an energy-band diagram showing a 3-dimensional expression by E(energy)-k(momentum)-x(location) for a specific portion 100 shown in FIG. 17.

Here, it is preferable that the intrinsic semiconductor layer 30 undoped with impurities has the same components as the direct bandgap semiconductor layer 21 for both bandgaps being the same as a direct bandgap.

As mentioned above, in case that the intrinsic semiconductor layer 30 is made of the same material layer as the direct bandgap semiconductor layer 21, the same condition of Equation (3) is needed.

And the p-type indirect bandgap semiconductor layer 15 and the n-type direct bandgap semiconductor layer 21 are preferred to form as $p^+$ and $n^+$, respectively, with impurity concentrations higher than those of the pn junction embodiment shown in FIG. 14.

By the results, as shown in FIG. 16, because Fermi level $E_F$ is overlapped with the conduction band minimum $E_{C2}$ or located around the valence band maximum $E_{V1}$ in both sides, in the Γ-valley conduction band of the n-type direct bandgap semiconductor layer 21 is collected much more electrons and in the valence band maximum of the p-type indirect bandgap semiconductor layer 15 is collected much more holes.

At this time, if a forward-biased voltage $V_f$ is applied, as shown in FIG. 17, the energy bends are shifted and the electrons collected in a Γ-valley conduction band of the n-type direct bandgap semiconductor layer 21 pass through a Γ-valley conduction band of the intrinsic semiconductor layer 30 and, as shown in FIG. 18, transport to a Γ-valley conduction band of the p-type indirect bandgap semiconductor layer 15 with forming the electron waterway 150 larger.

On the other hand, even if the valence band maximum $E_{V1}$ of the p-type indirect bandgap semiconductor layer 15 comes down by the forward-biased voltage, it cannot come down below the valence band maximum $E_{V3}$ of the intrinsic semiconductor layer 30 due to the condition of Equation (3). Thus, many holes collected in the valence band maximum $E_{V1}$ of the p-type indirect bandgap semiconductor layer 15 cannot be leaked through the intrinsic semiconductor layer 30 to the n-type direct bandgap semiconductor layer 21.

By the results, because much more electrons transported to the Γ-valley conduction band of the p-type indirect bandgap semiconductor layer 15 are recombined with many holes collected in the valence band maximum $E_{V1}$ of the p-type indirect bandgap semiconductor layer 15 with emitting much more lights. The efficiency of an electroluminescence device can be increased.

FIG. 18 is an energy-band diagram showing a magnified 3-dimensional expression by E(energy)-k(momentum)-x(location) for a specific portion 100 shown in FIG. 17.

A bold line 140 drawn in FIG. 17 connects a conduction band minimum $E_{C2}$ of the n-type direct bandgap semiconductor layer 21, a conduction band minimum $E_{C3}$ of the intrinsic semiconductor layer 30 and a conduction band minimum $E_{C1}$ of the p-type indirect bandgap semiconductor layer 15. It is expressed as the line 140 that curved energy-band surfaces of each region 110 and 120 meet an E-x plane (K=0) 130 in FIG. 18.

Thus, it can be known that the connection of Γ-valley conduction bands of each region forms the electron waterway 150 for transporting electrons in this embodiment.

Hereinafter, referring to the accompanying FIGS. 6 to 12, the detailed embodiments of the technical idea of the present invention are described.

Figure 6:
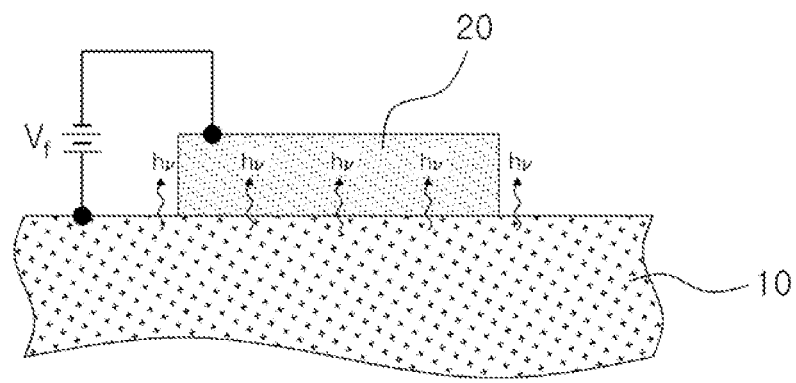
FIGS. 6 to 12 are cross sectional views showing structures formed by each embodiment of the present invention.

FIG. 6 shows an embodiment that uses a p-type semiconductor substrate itself having an indirect bandgap as the p-type indirect bandgap semiconductor layer 10. The n-type direct bandgap semiconductor layer 20 is formed on the substrate by a heterojunction and is etched into a predetermined pattern.

By applying a forward-biased voltage $V_f$ to both sides of the p-type indirect bandgap semiconductor layer 10 and the n-type direct bandgap semiconductor layer 10 embodied as mentioned above, as shown in FIG. 6, the substrate as the p-type indirect bandgap semiconductor layer 10 emits a light (hu) by the above-mentioned mechanism as shown in FIG. 15.

The real material selected as the p-type indirect bandgap semiconductor layer 10 in this embodiment can be a single crystal silicon (Si) or germanium (Ge) widely used as a semiconductor substrate.

Figure 19:
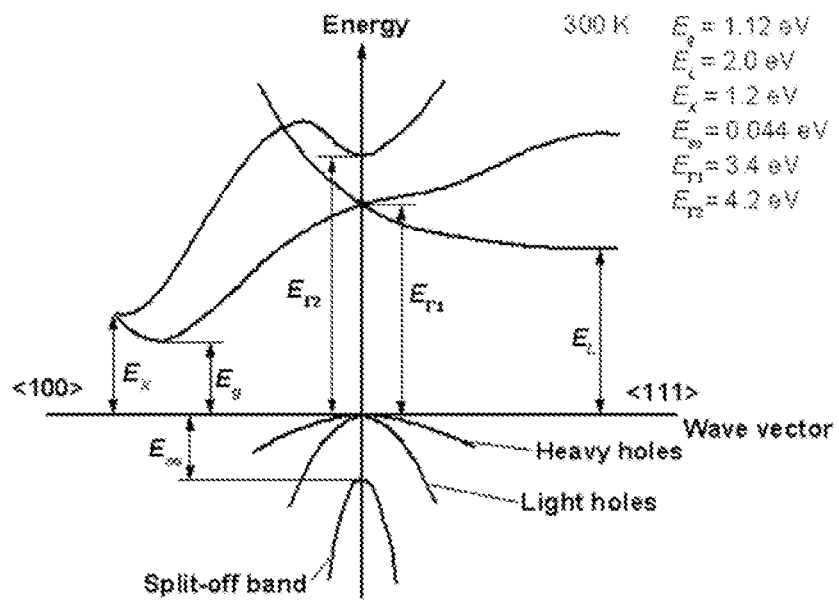
FIG. 19 is an E-k diagram of silicon (Si) at room temperature (300K).
Figure 20:
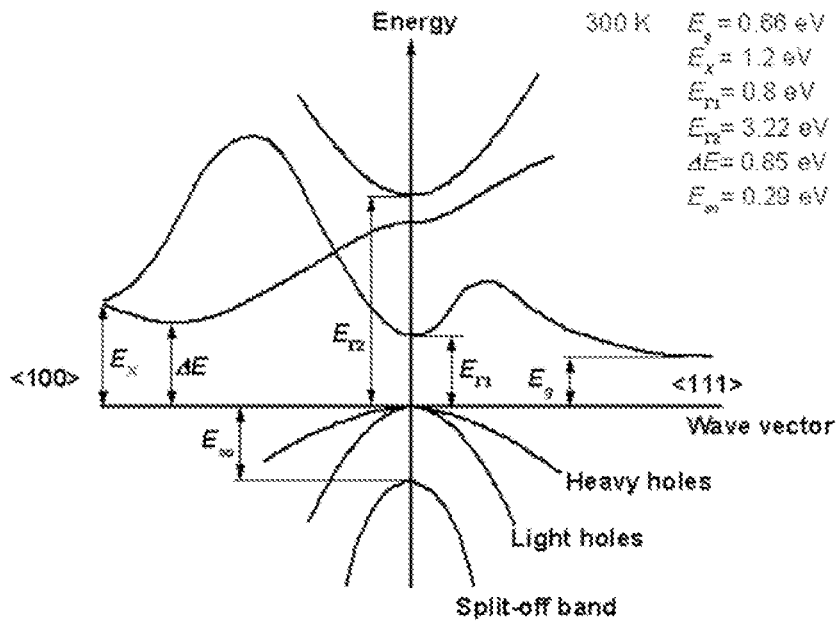
FIG. 20 is an E-k diagram of germanium (Ge) at room temperature (300K).

FIGS. 19 and 20 are E-k diagrams of silicon (Si) and germanium (Ge) at room temperature (300K), respectively.

According to FIG. 19, it can be known that silicon has a conduction band minimum $E_C$ at an X-valley formed in <100> direction, 1.12 eV indirect bandgap, and two Γ-valleys having a local conduction-band minimum at Γ-point. Electrons supplied from outside begin to be filled from a lower Γ-valley of the two and the electrons filled in the lower Γ-valley are recombined with holes collected in a valence band maximum with emitting a light. Thus, according to this embodiment, the light emitted from silicon has a wavelength corresponding to a bandgap $E_{\Gamma1}$=3.4 eV (refer to Equation (1)).

In this embodiment, in order to use silicon as the p-type indirect bandgap semiconductor layer 10 for emitting a light having a wavelength corresponding to $E_{\Gamma1}$=3.4 eV as mentioned above, by Equation (3), the n-type direct bandgap semiconductor layer 20 has to be selected from material layers having a direct bandgap larger than $E_{\Gamma1}$=3.4 eV.

Figure 21:
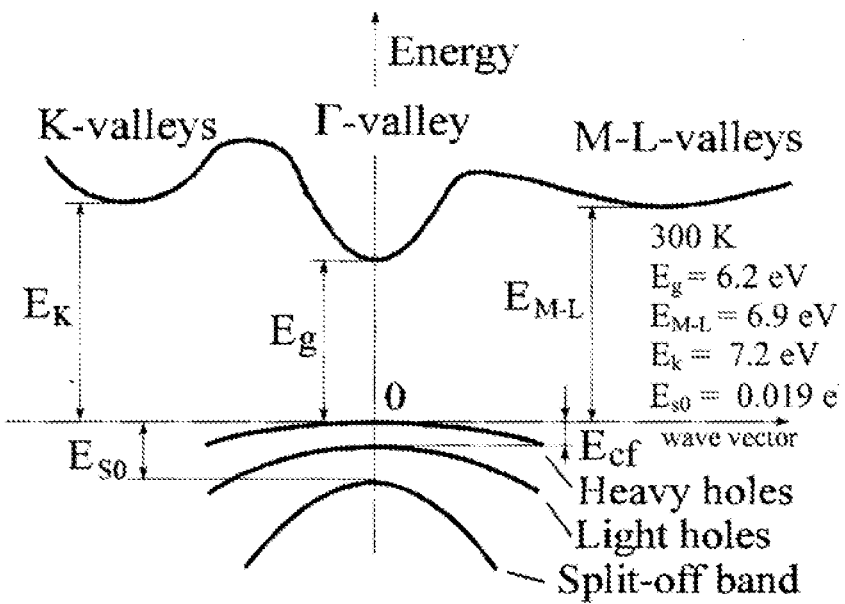
FIG. 21 is an E-k diagram of aluminum nitride (AlN) at room temperature (300K).
Figure 22:
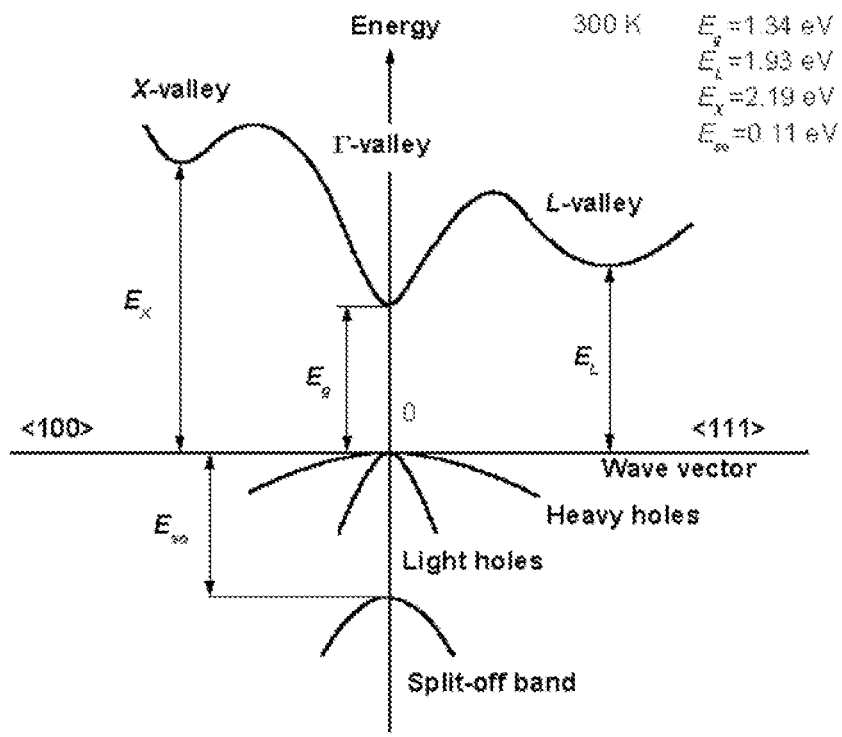
FIG. 22 is an E-k diagram of indium phosphide (InP) at room temperature (300K).
Figure 23:
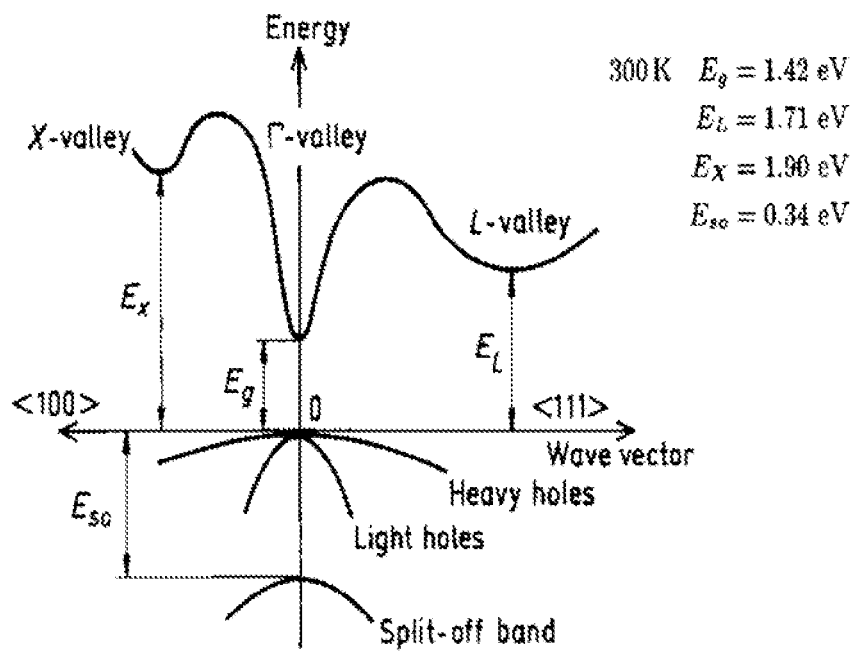
FIG. 23 is an E-k diagram of gallium arsenide (GaAs) at room temperature (300K).

FIGS. 21 to 23 show exemplary direct bandgap semiconductors having a conduction band minimum at Γ-valley, among them, if silicon is selected as the p-type indirect bandgap semiconductor layer 10, the direct bandgap semiconductor to meet the condition of Equation (3) can be aluminum nitride (AlN) that has 6.2 eV bandgap in an E-k diagram as shown in FIG. 21. Thus, aluminum nitride (AlN) can be used to form the n-type direct bandgap semiconductor layer 20.

On the other hand, if the p-type indirect bandgap semiconductor layer 10 is formed with a germanium (Ge) substrate, as confirmed in FIG. 20, germanium (Ge) forms two Γ-valleys in an E-k diagram and a lower Γ-valley of the two has a bandgap $E_{\Gamma1}$=0.8 eV. Thus, the n-type direct bandgap semiconductor layer 20 has to be formed with a material layer having a direct bandgap larger than $E_{\Gamma1}$=0.8 eV.

Because all bandgaps of exemplary direct bandgap semiconductors shown in FIGS. 21 to 23 are larger than 0.8 eV bandgap of the first Γ-valley of germanium (Ge), anyone selected from them can form the n-type direct bandgap semiconductor layer 20.

However, because the n-type direct bandgap semiconductor layer 20 is needed to be grown on the p-type indirect bandgap semiconductor layer 10 by an epitaxial process, etc., it is preferred to select a material having a similar lattice constant with the p-type indirect bandgap semiconductor layer 10.

Because electrons transporting from a Γ-valley to a Γ-valley can be leaked by traps, etc. being on a heterojunction surface of the p-type indirect bandgap semiconductor layer 10 and the n-type direct bandgap semiconductor layer 20. It is more preferable that lattice constants of both material layers are 1% or less different from each other for preventing the electron loss maximally.

Therefore, considering that lattice constants of germanium (Ge) and gallium arsenide (GaAs) are equal to 5.65 Å, it is preferred to form the n-type direct bandgap semiconductor layer 20 with gallium arsenide (GaAs).

Figure 24:
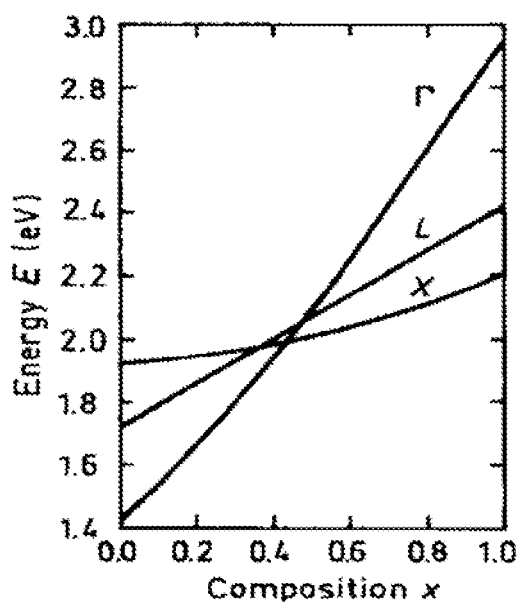
FIG. 24 is a diagram showing changes of energy (E) in a Γ-valley, an L-valley and an X-valley depending on the composition (x) of aluminum element during formation of aluminum-gallium-arsenide compound ($Al_xGa_{1-x}As$) by adding aluminum (Al) instead of gallium (Ga) in FIG. 23.

And, when aluminum-gallium-arsenide compound ($Al_xGa_{1-x}As$) is formed from gallium arsenide (GaAs) by adding aluminum (Al) instead of gallium (Ga), as confirmed in FIG. 24, energies (E) of a Γ-valley, an L-valley and an X-valley can be changed by an aluminum composition (x). Therefore, it is possible to increase the bandgap of aluminum-gallium-arsenide compound ($Al_xGa_{1-x}As$) to about 1.9 eV by elevating the composition rate of aluminum (Al) to about 40% with the Γ-valley being a conduction band minimum to remain as a direct bandgap material.

Therefore, if the n-type direct bandgap semiconductor 20 is formed with aluminum-gallium-arsenide compound ($Al_xGa_{1-x}As$) and the composition rate of aluminum (Al) is optimally controlled, it has an advantage that elevates a holding margin of holes, i.e., an operating margin at an on operation by applying a forward-biased voltage in the p-type indirect bandgap semiconductor layer 10.

Figure 7:
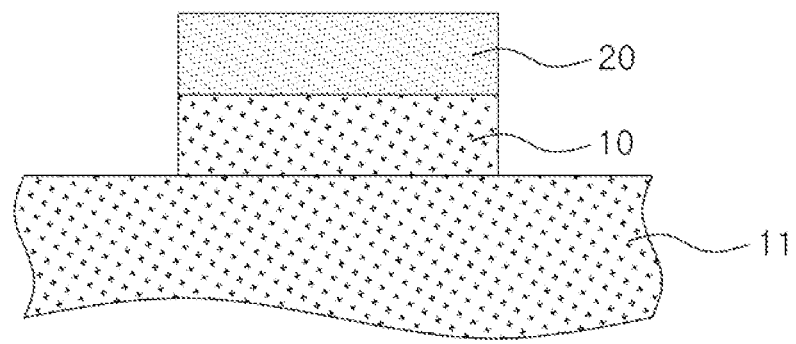

FIG. 7 shows another embodiment that forms the p-type direct bandgap semiconductor layer 10 by etching a p-type semiconductor substrate having an indirect bandgap or by an epitaxial growth on a p-type semiconductor substrate 11 having an indirect bandgap. At this time, the p-type epitaxial layer 10 can be formed with two or more material layers having an indirect bandgap by changing the composition of each layer.

The n-type direct bandgap semiconductor layer 20 is formed by a heterjunction on the p-type indirect bandgap semiconductor layer 10.

Because a description of each layer is the same as that described in the embodiment according to FIG. 6, the repeated description is omitted.

Figure 8:
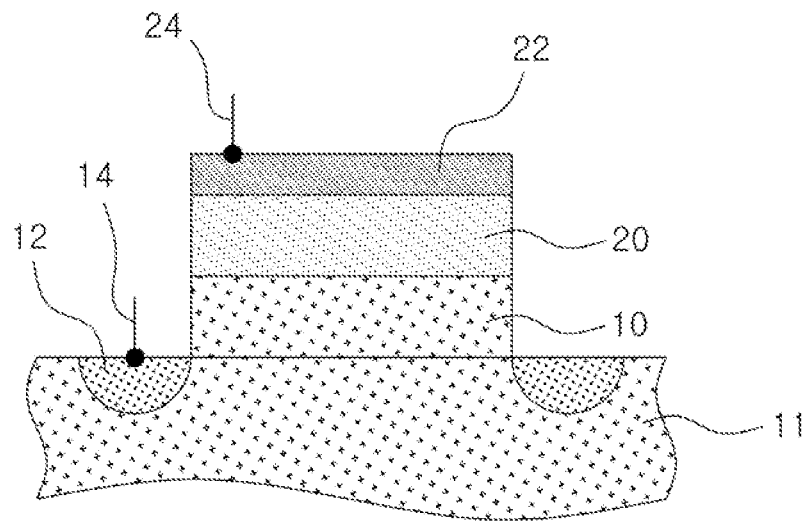

To reduce contact resistances in electrical connections of the p-type indirect bandgap semiconductor layer 10 and the n-type direct bandgap semiconductor layer 20 in the embodiment according to FIG. 7, FIG. 8 shows that a high-doped $p^+$ contact portion 12 on the substrate 11 and a high-doped $n^+$ contact portion 22 on the n-type direct bandgap semiconductor layer 20 are further formed respectively and electrical contacts 14 and 24 connect to each of the contact portions.

Here, the high-doped $p^+$ and $n^+$ mean that the doping concentrations of each impurity are higher than that of a p-type semiconductor substrate.

Because a light generated from the p-type indirect bandgap semiconductor layer 10 emits through the $n^+$ contact portion 22, it is preferable that a top contact 24 connects to a transparent electrode (not shown) formed on the $n^+$ contact portion 22.

Figure 9:
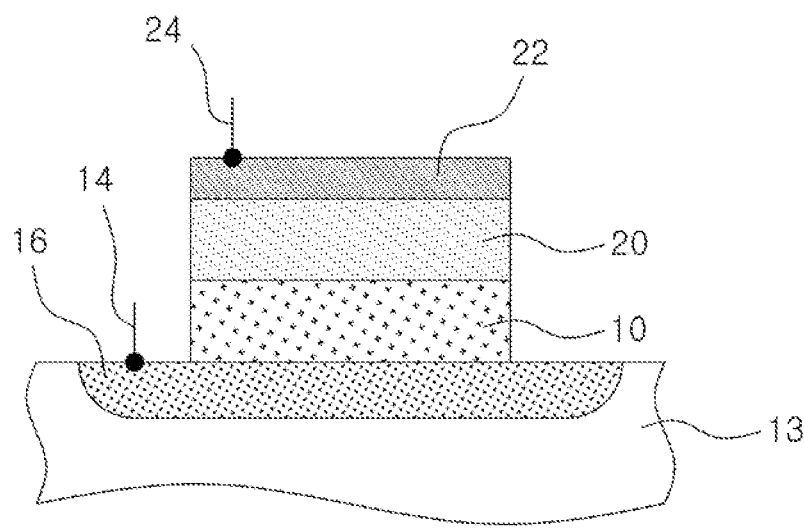

In the embodiment of FIG. 8, the $p^+$ contact portion 12 can be formed to surround around the p-type indirect bandgap semiconductor layer 10. But FIG. 9 shows that the $p^+$ contact portion 16 can expand to whole bottom of the p-type indirect bandgap semiconductor layer 10. At this time, the semiconductor substrate 13 can be formed with p-type, but it is preferred to form with an n-type substrate or an n-type well for insulating from neighbor devices.

Figure 10:
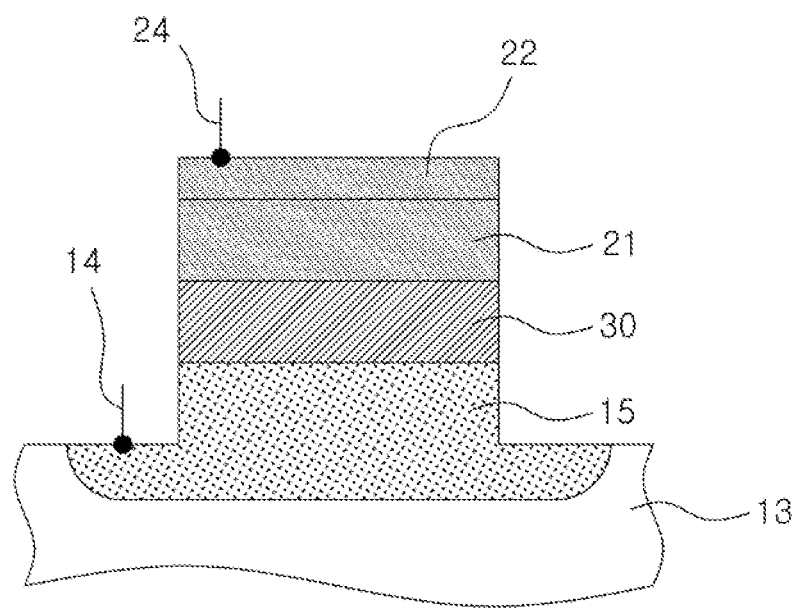

FIG. 10 shows another embodiment that a p-type indirect bandgap semiconductor layer 15, an intrinsic semiconductor layer 30 and an n-type direct bandgap semiconductor layer 21 are sequentially formed on a semiconductor substrate 13 having an indirect bandgap.

Here, the p-type indirect bandgap semiconductor layer 15 and the n-type direct bandgap semiconductor layer 21 are preferred to be doped with high concentrations that are the same level as the $p^+$ contact portion 12 and the $n^+$ contact portion 22, respectively, in the embodiment of FIG. 8.

And, the intrinsic semiconductor layer 30 is preferred to form with an undoped semiconductor layer or with a material layer having the same component and/or direct bandgap size as the n-type direct bandgap semiconductor layer 21.

Because a description of each layer of the embodiment shown in FIG. 10 is the same as those described in the embodiments according to FIGS. 6, 8 and 9, the repeated description is omitted. But an $n^+$ contact portion 22 shown in FIG. 10 can be formed with a transparent electrode or a cladding layer to protect an n-type direct bandgap semiconductor layer 21.

As a detailed embodiment having a structure shown in FIG. 10, the p-type indirect bandgap semiconductor layer 15 is formed with germanium (Ge) that is the same as the substrate. And the intrinsic semiconductor layer 30 and the n-type direct bandgap semiconductor layer 21 are formed with aluminum-gallium-arsenide compound ($Al_xGa_{1-x}As$) having a lattice constant which is similar to that of germanium (Ge) for increasing an operating margin by controlling composition (x) of aluminum.

An operation mode of the embodiment shown in FIG. 10 can be described by energy-band diagrams drawn in FIGS. 16 to 18. But because it is sufficiently described in the above-mentioned embodiments shown in FIGS. 16 to 18, the repeated description is omitted.

Figure 11:
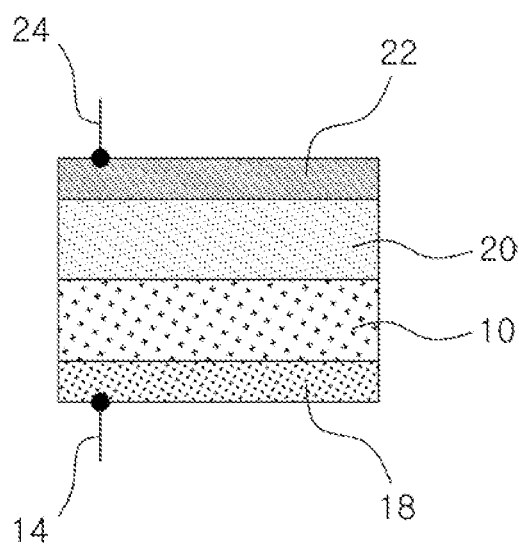

FIG. 11 shows an embodiment the same as the embodiment shown in FIG. 9, but shows that an electrical contact 14 of a p-type indirect bandgap semiconductor layer 10 can be formed on the backside of a semiconductor substrate 18.

Figure 12:
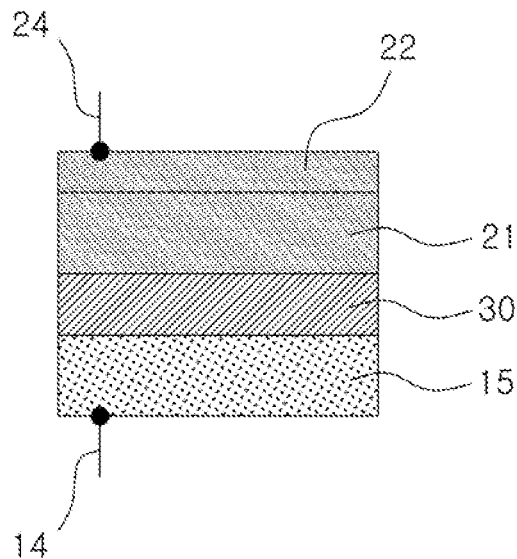

FIG. 12 shows an embodiment the same as the embodiment shown in FIG. 10, but shows that an electrical contact 14 of a p-type indirect bandgap semiconductor layer 15 can be formed on backside of a semiconductor substrate being in a body with a p-type indirect bandgap semiconductor layer 15.

The embodiments shown in FIGS. 11 and 12 have an advantage in that a light opening area can be easily expanded.

In the embodiments shown in FIGS. 6 to 12, the n-type direct bandgap semiconductor layers 20 and 21 can be formed with two or more layers or be formed to have a lattice constant adjusted by tensile stress or compressive stress for maintaining a conduction band minimum at the Γ-point or on k within the Γ-valley of the indirect bandgap semiconductor layers 10 and 15, controlling a direct bandgap to meet the condition of Equation (3), or matching up with the lattice constant of the indirect bandgap semiconductor layer 10 or 15.

And the embodiments shown in FIGS. 6 to 12 show a vertical structure that the direct bandgap semiconductor layer 20 or 21 is vertically formed on the indirect bandgap semiconductor layer 10 or 15, but not limited to the vertical structure, a horizontal structure that a direct bandgap semiconductor layer is horizontally formed by a heterojunction on a side wall of an indirect bandgap semiconductor layer can be formed. For example, a substrate made of an indirect bandgap semiconductor layer is etched to form a stair-step structure and a direct bandgap semiconductor layer is directly grown by an epitaxial growth on the side wall of the stair-step structure to emit a light from the side wall of the substrate.

In case that an indirect bandgap semiconductor layer is used as a light emitting layer and an electron supply means is formed by a heterojunction with a direct bandgap semiconductor layer on the indirect bandgap semiconductor layer, any structure can be embodied. Thus, it should be considered in interpreting the appended claims.

And the above-mentioned indirect bandgap semiconductor layer can be formed with one or more materials selected of Si, Ge, SiC, AlP, AlAs, AlSb, GaP, PbS, PbSe, PbTe and a compound (or an alloy) bonded with one or more new elements of Group III or V. Although it is not classified to a conventional semiconductor, materials forming at least one Γ-valley with a local conduction-band minimum at the Γ-point in an E-k diagram can be used as the indirect bandgap semiconductor layer of the embodiments.

And the above-mentioned direct bandgap semiconductor layer can be formed with one or more materials selected of AlN, InP, GaAs, GaN, GaSb, InAs, InSb, ZnS, ZnSe, ZnTe, CdS, CdSe, CdTe and a compound (or an alloy) bonded with one or more new elements of Group III or V. Although it is not classified to a conventional semiconductor, materials having a conduction band minimum at the Γ-point in an E-k diagram can be used as the direct bandgap semiconductor layer of the embodiments.

Thus, the terms of "an indirect bandgap semiconductor layer" and "a direct bandgap semiconductor layer" in the above-mentioned description and the appended claims should be interpreted to indicate all the materials including the above-mentioned materials.

What is claimed is:

1. An electroluminescence device, comprising:
   an indirect bandgap semiconductor layer forming a Γ-valley with a local conduction-band minimum at a Γ-point in an E-k diagram; and
   a direct bandgap semiconductor layer formed by a heterojunction on the indirect bandgap semiconductor layer for supplying electrons to the Γ-valley of the indirect bandgap semiconductor layer,
   wherein the indirect bandgap semiconductor layer is a light emitting layer,
   wherein the direct bandgap semiconductor layer has a bandgap larger than the difference between a Γ-valley minimum of the indirect bandgap semiconductor layer and a valence band maximum of the indirect bandgap semiconductor layer,
   wherein the indirect bandgap semiconductor layer is doped with p-type impurities and the direct bandgap semiconductor layer is doped with n-type impurities,
   wherein the indirect and direct bandgap semiconductor layers have a contact portion for supplying an external power, respectively,
   wherein the indirect bandgap semiconductor layer emits a light by recombining electrons transported from a Γ-valley conduction band of the direct bandgap semiconductor layer to a Γ-valley conduction band of the indirect bandgap semiconductor layer with holes located at a valence band maximum of the indirect bandgap semiconductor layer when a forward-biased voltage is applied across a pn junction between the indirect and direct bandgap semiconductor layers through the contact portions,
   wherein the indirect bandgap semiconductor layer is formed on a p-type semiconductor substrate having an indirect bandgap as one body,
   wherein the contact portion of the indirect bandgap semiconductor layer is formed on the p-type semiconductor substrate as a p+ contact portion, the p+ contact portion surrounding around the indirect bandgap semiconductor layer,
   wherein the indirect bandgap semiconductor layer is a single crystal silicon (Si) or germanium (Ge), and
   wherein the direct bandgap semiconductor layer has a conduction band minimum larger than or equal to the Γ-valley minimum of the indirect bandgap semiconductor layer and has a valence band maximum smaller than the valence band maximum of the indirect bandgap semiconductor layer.

2. The electroluminescence device of claim 1, wherein the direct bandgap semiconductor layer has a conduction band minimum located at the Γ-point or within the Γ-valley of the indirect bandgap semiconductor layer.

3. The electroluminescence device of claim 2, wherein the direct bandgap semiconductor layer is formed with two or more layers.

4. The electroluminescence device of claim 2, wherein the direct bandgap semiconductor layer has a lattice constant adjusted by tensile stress or compressive stress.

5. The electroluminescence device of claim 1, wherein the indirect bandgap semiconductor layer is an upper part of the semiconductor substrate defined by etching.

6. The electroluminescence device of claim 1,
   wherein the indirect bandgap semiconductor layer is formed by epitaxial growth on the semiconductor substrate.

7. The electroluminescence device of claim 6,
   wherein the semiconductor substrate is the same semiconductor material as the indirect bandgap semiconductor layer, and wherein the indirect and direct bandgap semiconductor layers are doped with higher concentration than the semiconductor substrate.

8. The electroluminescence device of claim 7, wherein an intrinsic semiconductor layer undoped with impurities is further formed between the indirect and direct bandgap semiconductor layers.

9. The electroluminescence device of claim 8, wherein the intrinsic semiconductor layer and the direct bandgap semiconductor layer are made of identical components.

10. The electroluminescence device of claim 1, wherein the direct bandgap semiconductor layer has a lattice constant 1% or less different from that of the indirect bandgap semiconductor layer.

* * * * *